US010157774B1

(12) United States Patent
Peters et al.

(10) Patent No.: US 10,157,774 B1
(45) Date of Patent: Dec. 18, 2018

(54) CONTACT SCHEME FOR LANDING ON DIFFERENT CONTACT AREA LEVELS

(71) Applicant: GLOBALFOUNDRIES INC., Grand Cayman (KY)

(72) Inventors: Carsten K. Peters, Dresden (DE); Peter Baars, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/658,570

(22) Filed: Jul. 25, 2017

(51) Int. Cl.
| | |
|---|---|
| *H01L 21/768* | (2006.01) |
| *H01L 29/78* | (2006.01) |
| *H01L 29/06* | (2006.01) |
| *H01L 29/08* | (2006.01) |
| *H01L 23/535* | (2006.01) |
| *H01L 23/522* | (2006.01) |
| *H01L 23/532* | (2006.01) |

(Continued)

(52) U.S. Cl.
CPC ...... *H01L 21/7681* (2013.01); *H01L 21/7684* (2013.01); *H01L 21/76834* (2013.01); *H01L 21/76843* (2013.01); *H01L 21/76877* (2013.01); *H01L 21/76895* (2013.01); *H01L 23/528* (2013.01); *H01L 23/5221* (2013.01); *H01L 23/535* (2013.01); *H01L 23/53228* (2013.01); *H01L 23/53266* (2013.01); *H01L 29/0649* (2013.01); *H01L 29/0847* (2013.01); *H01L 29/7838* (2013.01); *H01L 21/76816* (2013.01); *H01L 23/485* (2013.01); *H01L 23/5226* (2013.01); *H01L 2221/1036* (2013.01)

(58) Field of Classification Search
CPC ............... H01L 23/485; H01L 23/5226; H01L 21/76816

USPC .......................................... 438/637; 257/758
See application file for complete search history.

(56) References Cited

U.S. PATENT DOCUMENTS 5,451,543 A 9/1995 Woo et al.
8,042,095 B2 10/2011 Low
(Continued)

FOREIGN PATENT DOCUMENTS

| CN | 103378033 | 10/2013 |
|---|---|---|
| DE | 102016114823 | 1/2018 |

(Continued)

OTHER PUBLICATIONS

TW Office Action dated Mar. 12, 2018, in related Taiwan Application No. 106132446, 8 pages.
(Continued)

*Primary Examiner* — George Fourson, III
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to a contact scheme for landing on different contact area levels of a semiconductor structure and methods of manufacture. The structure includes a first contact at a first level of the structure; a jumper contact at a second, upper level of the structure; an etch stop layer having an opening over the first contact and partially encapsulating the jumper contact with an opening exposing the jumper contact; and contacts in electrical contact with the first contact at the first level and the jumper contact at the second, upper level, through the openings.

20 Claims, 7 Drawing Sheets

(51) Int. Cl.
*H01L 23/528* (2006.01)
*H01L 23/485* (2006.01)

(56) References Cited

U.S. PATENT DOCUMENTS

| | | | |
|---|---|---|---|
| 9,780,199 B2 * | 10/2017 | Hung | H01L 29/66795 |
| 2003/0211731 A1 * | 11/2003 | Kai | H01L 28/40 |
| | | | 438/638 |
| 2004/0241917 A1 * | 12/2004 | Schwan | H01L 21/84 |
| | | | 438/151 |
| 2006/0183280 A1 * | 8/2006 | Lee | H01L 21/76807 |
| | | | 438/239 |
| 2006/0186485 A1 * | 8/2006 | Cho | H01L 27/105 |
| | | | 257/401 |
| 2010/0224936 A1 * | 9/2010 | Hokazono | H01L 21/7681 |
| | | | 257/368 |
| 2012/0299072 A1 * | 11/2012 | Kim | H01L 21/823456 |
| | | | 257/296 |
| 2013/0207193 A1 * | 8/2013 | Haneda | H01L 27/088 |
| | | | 257/365 |
| 2013/0285125 A1 | 10/2013 | Chen et al. | |
| 2014/0353787 A1 * | 12/2014 | Peng | H01L 27/14627 |
| | | | 257/432 |
| 2015/0380305 A1 * | 12/2015 | Basker | H01L 21/76846 |
| | | | 257/77 |
| 2016/0336183 A1 | 11/2016 | Yuan et al. | |
| 2017/0207387 A1 | 7/2017 | Yang et al. | |

FOREIGN PATENT DOCUMENTS

| | | | |
|---|---|---|---|
| JP | 2012043868 A | * | 3/2012 |
| TW | 201725682 | | 7/2017 |

OTHER PUBLICATIONS

DE Office Action dated Mar. 27, 2018, in related Germany Application No. 102017219677.7, 35 pp.

* cited by examiner

CONTACT SCHEME FOR LANDING ON DIFFERENT CONTACT AREA LEVELS

FIELD OF THE INVENTION

The present disclosure relates to semiconductor structures and, more particularly, to a contact scheme for landing on different contact area levels of a semiconductor structure and methods of manufacture.

BACKGROUND

Transistors are fundamental device elements of modern digital processors and memory devices, and have found numerous applications in various areas of electronics including data processing, data storage, and high-power applications. Currently, there are a variety of transistor types and designs that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and super-junction or multi-drain transistors.

Within a MOSFET family of transistors, a fully-depleted, silicon-on-insulator (FDSOI) platform enables good performance without increasing power consumption and cost. In a FDSOI platform, a semiconductor layer, such as silicon, germanium, silicon germanium, etc., is formed on an insulator layer, e.g., a buried oxide layer (BOX) layer, which is, in turn, formed on a semiconductor device. A depletion region of the FD SOI platform covers the semiconductor layer, which can enable high switching speeds.

SUMMARY

In an aspect of the disclosure, a structure comprises: a first contact at a first level of the structure; a jumper contact at a second, upper level of the structure; an etch stop layer having an opening over the first contact and partially encapsulating the jumper contact with an opening exposing the jumper contact; and contacts in electrical contact with the first contact at the first level and the jumper contact at the second, upper level, through the openings.

In an aspect of the disclosure, a method comprises: forming a first contact at a first level of a structure; forming a jumper contact at a second, upper level of the structure; forming an etch stop layer having an opening over the first contact and an opening over the jumper contact; and forming contacts in electrical contact with the first contact at the first level and the jumper contact at the second, upper level, through the openings of the etch stop layer.

In an aspect of the disclosure, a method comprises: forming a gate structure on a substrate; forming a raised source/drain region on the substrate; forming a first contact to the gate structure at a first level; forming a second contact to the raised source/drain region at the first level; forming a jumper contact to the second contact area at a second, upper level, with respect to the first level; and forming dual damascene copper wiring structures landing on the first contact at the first level and on the jumper contact at the second, upper level.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a contact scheme for landing on different contact area levels of a semiconductor structure and methods of manufacture. More specifically, the present disclosure is directed to a semiconductor structure in which a middle of the line (MOL) construction has local interconnects (e.g., jumper) and gate fly-over features incorporated into the interlevel dielectric (ILD) above a gate level. Advantageously, the present disclosure provides benefits for wiring/connections by providing via structures at on two different levels.

In several MOL approaches, tungsten (i.e., W) layers are placed in subsequent levels which are in contact with copper vias at a via level, V0. Since via etching is extremely sensitive, the copper can usually only land on the same underlying level. In contrast, the present disclosure allows the copper via to land on different MOL levels. In particular embodiments, a nitride liner can serve as an etch stop layer on two different levels. For example, a nitride liner can be used to cover a lower wiring level and encapsulate an upper wiring level. A via is etched in an ILD layer, using the etch stop layer such that it can land on metal contacts on two different levels. In embodiments, the semiconductor structure can be a fully depleted silicon-on-insulator (FDSOI) technology, although bulk CMOS devices are also contemplated herein.

The semiconductor structure of the present disclosure can be manufactured in a number of ways using a number of different tools. In general, though, the methodologies and tools are used to form structures with dimensions in the micrometer and nanometer scale. The methodologies, i.e., technologies, employed to manufacture the semiconductor structure of the present disclosure have been adopted from integrated circuit (IC) technology. For example, the structures are built on wafers and are realized in films of material patterned by photolithographic processes on the top of a wafer. In particular, the fabrication of the semiconductor structure uses three basic building blocks: (i) deposition of thin films of material on a substrate, (ii) applying a patterned mask on top of the films by photolithographic imaging, and (iii) etching the films selectively to the mask.

Figure 1:
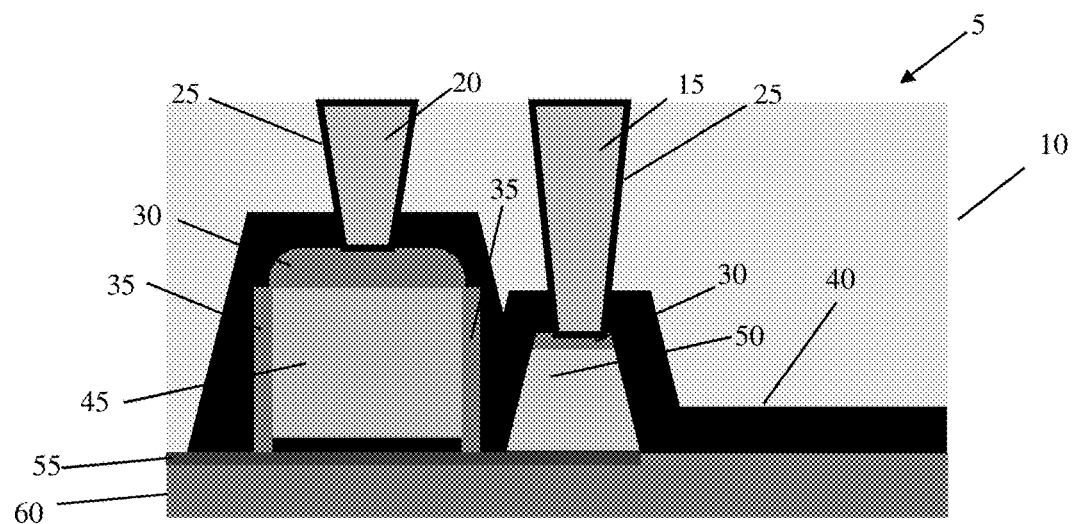
FIG. 1 shows an incoming structure and respective fabrication processes in accordance with aspects of the present disclosure.

FIG. 1 shows an incoming structure and respective fabrication processes in accordance with aspects of the present disclosure. More specifically, the structure 5 of FIG. 1 includes a silicon on insulator (SOI) substrate 55 formed on a buried oxide (BOX) layer 60. In embodiments, the semiconductor material of the SOI substrate 55 can be, but not limited to, Si, SiGe, SiGeC, SiC, GaAs, InAs, InP, and any other III/V or II/VI compound semiconductors. Although FIG. 1 shows an SOI substrate 55, bulk substrates are also contemplated herein. A raised source/drain 50 is formed on the substrate 55. The raised source/drain 50 can be epitaxially grown on the substrate 55, among other examples.

A gate structure 45 is formed on the substrate 55 using conventional deposition and patterning processes known to those of skill in the art. The gate structure 45 can include, e.g., gate dielectric material and poly or other metal or metal alloys. Sidewalls 35 can be formed on the gate structure 45. The sidewalls 35 can be, e.g., nitride material, deposited using conventional deposition techniques, e.g., chemical vapor deposition (CVD). Silicide regions 30 can be formed on a top surface of the gate structure 45 and the raised source/drain 50. The silicide regions 30 can be formed by deposition of a metal layer and annealing the metal layer to convert the metal to silicide, among other examples.

FIG. 1 further shows a capping layer 40 is deposited over the substrate 55, the silicide 30, and exposed portions of the insulator layer 60. In embodiments, the capping layer can be a nitride capping layer deposited using a conventional deposition method, e.g., CVD. An interlevel dielectric (ILD) 10 is deposited over the capping layer 40. The interlevel dielectric (ILD) 10 can include silicon dioxide (SiO$_2$) or tetraethylorthosilicate (TEOS), although other materials can be used. Contacts 15 and 20 are formed through the ILD 10, in contact with the silicide regions 30 of the source/drain 50 and the gate structure 45, as an example. The contacts 15, 20 can be formed by conventional lithography, etching and deposition processes, followed by a chemical mechanical planarization (CMP) process. The contacts 15, 20 can be filled with tungsten (i.e., W), lined with a barrier layer/liner 25, e.g., Tan/TiN. Further, the contact 15 is at a same level as the contact 20.

Figure 2:
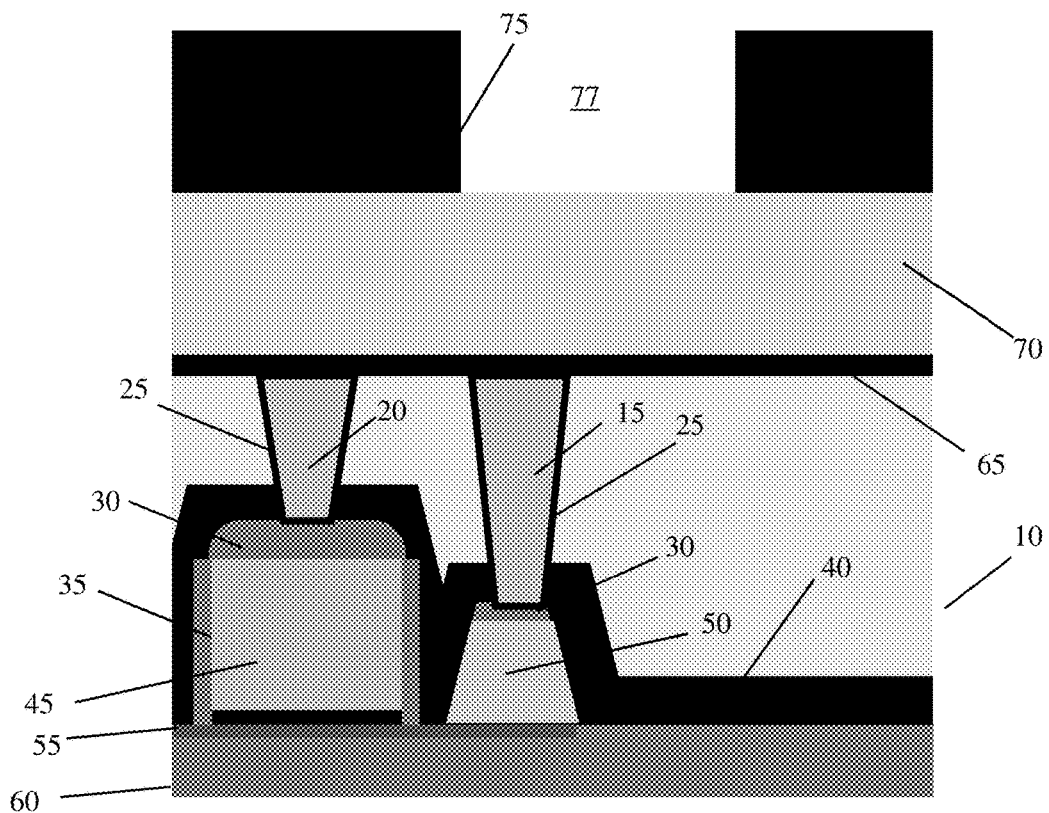
FIG. 2 shows a structure with a etch stop layer, amongst other features, and respective fabrication processes in accordance with aspects of the present disclosure.

In FIG. 2, an etch stop layer 65 is deposited over the contacts 15, 20. The etch stop layer 65 can be deposited by conventional deposition methods, e.g., CVD. In embodiments, the etch stop layer 65 can be silicon nitride (SiN), although other selective materials are contemplated herein. An interlevel dielectric layer 70 is deposited over the etch stop layer 65 using a CVD process, among other examples. In embodiments, the interlevel dielectric layer (ILD) 70 can be tetraethylorthosilicate (TEOS) or other insulator material.

Still referring to FIG. 2, a hardmask 75 can be deposited on the interlevel dielectric layer 70 using a CVD process, among other examples. The hardmask 75 can be deposited for a middle of the line (MOL) local interconnect/flyover feature. In embodiments, the hardmask 75 can include a photolithography resist and be anti-reflective. As further shown, the hardmask 75 can be patterned (e.g., opening 77) using conventional lithography and etching processes, e.g., reactive ion etching (RIE).

Figure 3:
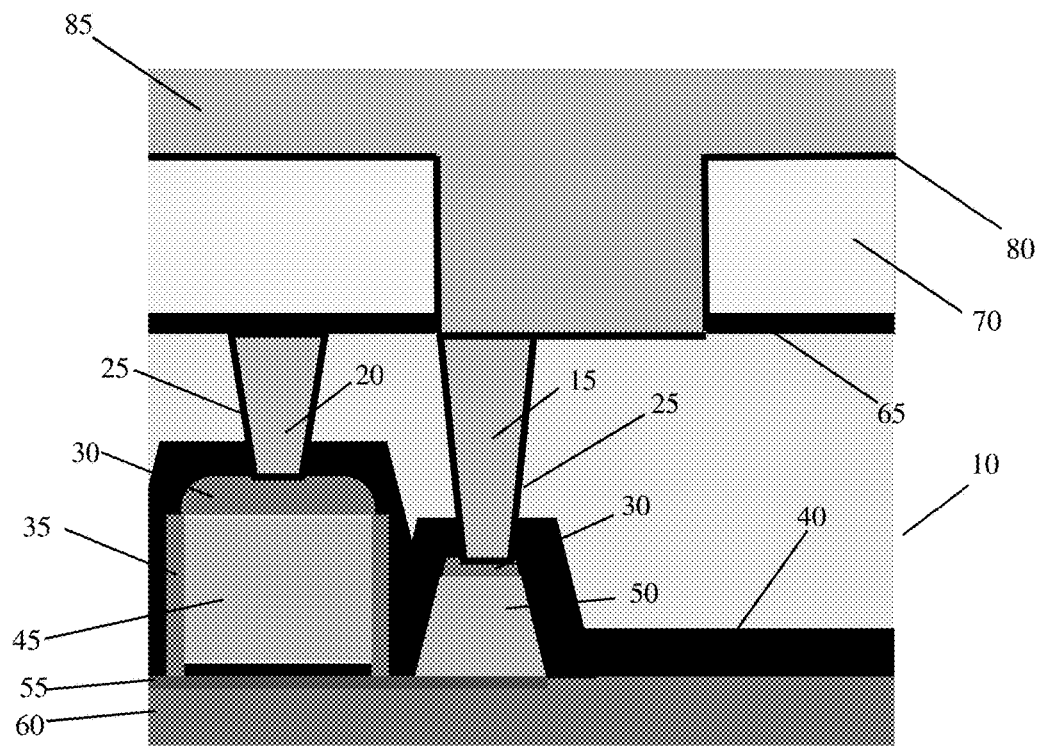
FIG. 3 shows a structure with tungsten fill, amongst other features, and respective fabrication processes in accordance with aspects of the present disclosure.

As shown in FIG. 3, the interlevel dielectric (ILD) 70 is etched to form an opening, which stops on the etch stop layer 65. A second etching process is then performed to remove portions of the etch stop layer 65, exposing the underlying contact 15. A liner 80 is deposited over the etched ILD 70 and in contact with the contact 15. In an embodiment, the liner 80 can be, e.g., TaN/TiN. After the liner 80 is deposited, a tungsten material 85 fills the remaining opening to make electrical contact with the contact 15.

Figure 4:
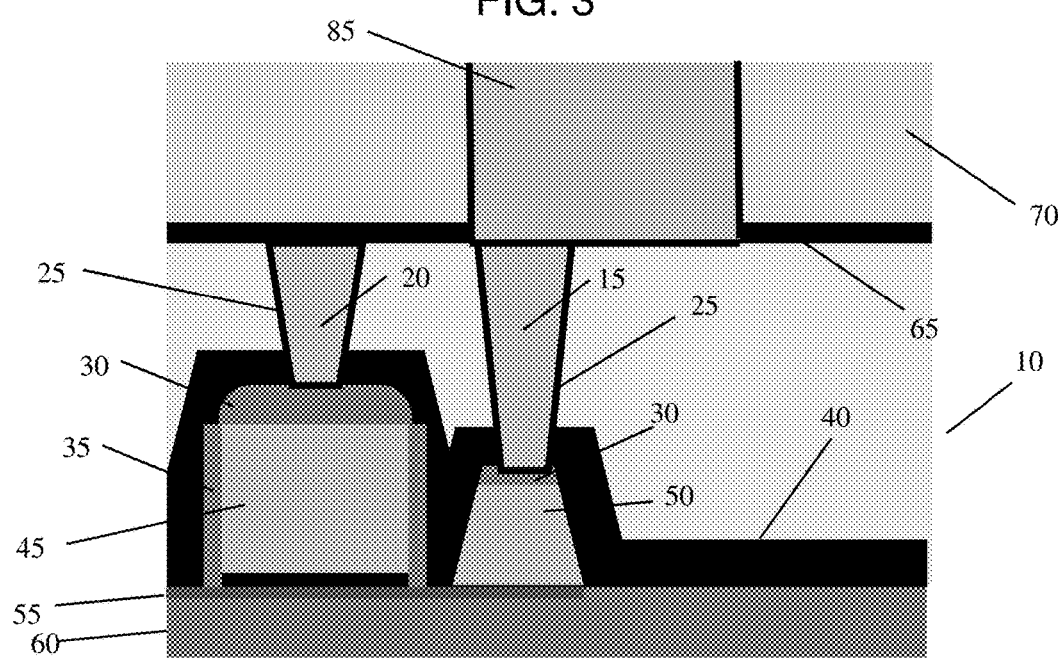
FIG. 4 shows a structure after planarization of the tungsten fill, amongst other features, and respective fabrication processes in accordance with aspects of the present disclosure.
Figure 5:
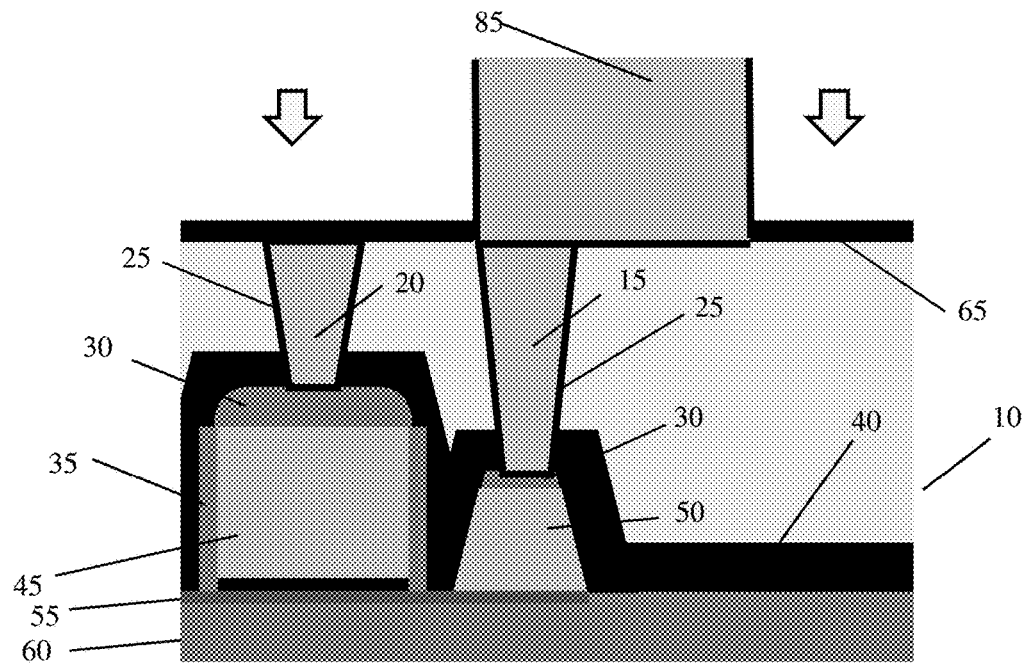
FIG. 5 shows a structure with a plug, amongst other features, and respective fabrication processes in accordance with aspects of the present disclosure.

In FIG. 4 the fill material 85 is subjected to a chemical mechanical planarization (CMP). In embodiments, the fill material 85 is a jumper/fly over feature (i.e., jumper contact 85) which is one level above the contacts 15, 20. The jumper contact 85 is in electrical contact with the contact 15. In FIG. 5, the ILD 70 is removed by a wet oxide etching process as indicated by the arrows. In embodiments, the wet oxide removal process can be a hydrofluoric acid (HF) etching process, which stops on the etch stop layer 65. In this way, the underlying features can be protected during the wet oxide removal process. This process will also create tungsten plugs from the fill material, e.g., feature 85 (i.e., jumper contact 85).

Figure 6:
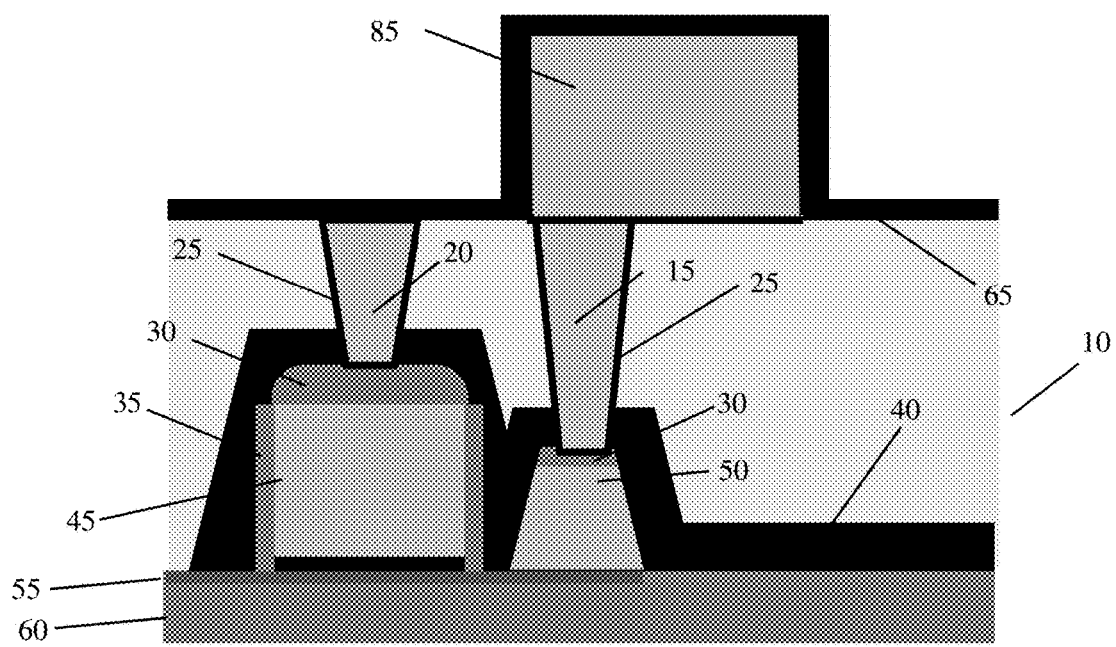
FIG. 6 shows a structure with an etch stop layer on the plug and other surfaces, amongst other features, and respective fabrication processes in accordance with aspects of the present disclosure.

In FIG. 6, any removal of the etch stop layer 65 during etching process can be re-deposited. For example, the etch stop layer 65 is thickened by a deposition process, which covers the contact 20 and also now encapsulates the plug 85 (i.e., jumper/fly over). The etch stop layer 65 can be deposited by a CVD process, among other examples. In embodiments, the etch stop layer 65 can be SiN.

Figure 7:
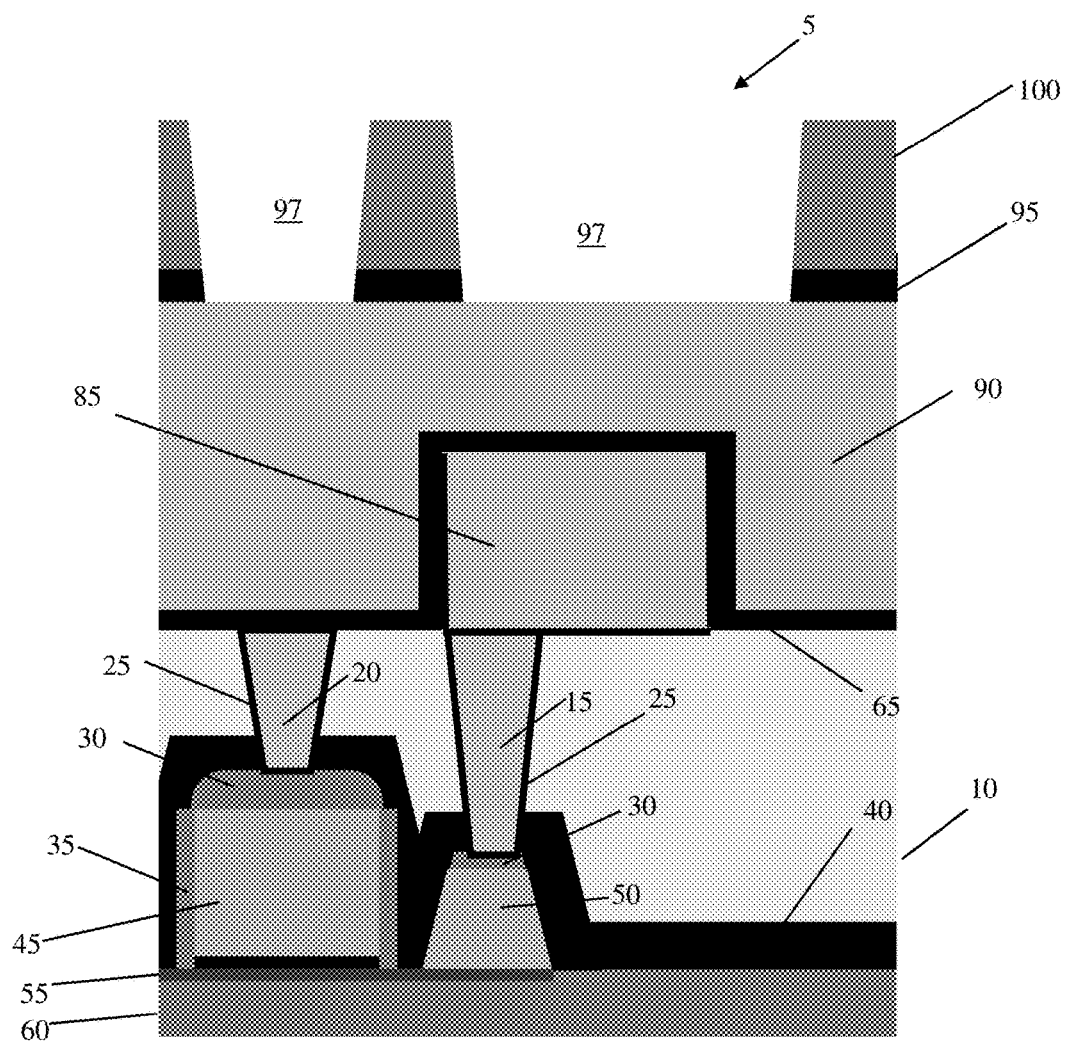
FIG. 7 shows a structure with a low dielectric film, hard mask, and metal, amongst other features, and respective fabrication processes in accordance with aspects of the present disclosure.

In FIG. 7, an insulator material 90 (e.g., low-k dielectric) is deposited over the etch stop layer 65 using, e.g., a CVD process. In embodiments, the insulator material 90 can be SiCOH or other insulator materials. For example, the insulator material 90 can be a low-k dielectric (BLOK). The insulator material 90 is subject to a CMP process. A material 95, e.g., TiN, and a hardmask 100 are deposited on the low-k dielectric material. At least one opening 97 is formed in the material 95 and the hardmask 100 using conventional lithography and etching processes. Any hardmask and/or other materials of the lithography stack can be removed by conventional stripants and/or etching processes.

Figure 8:
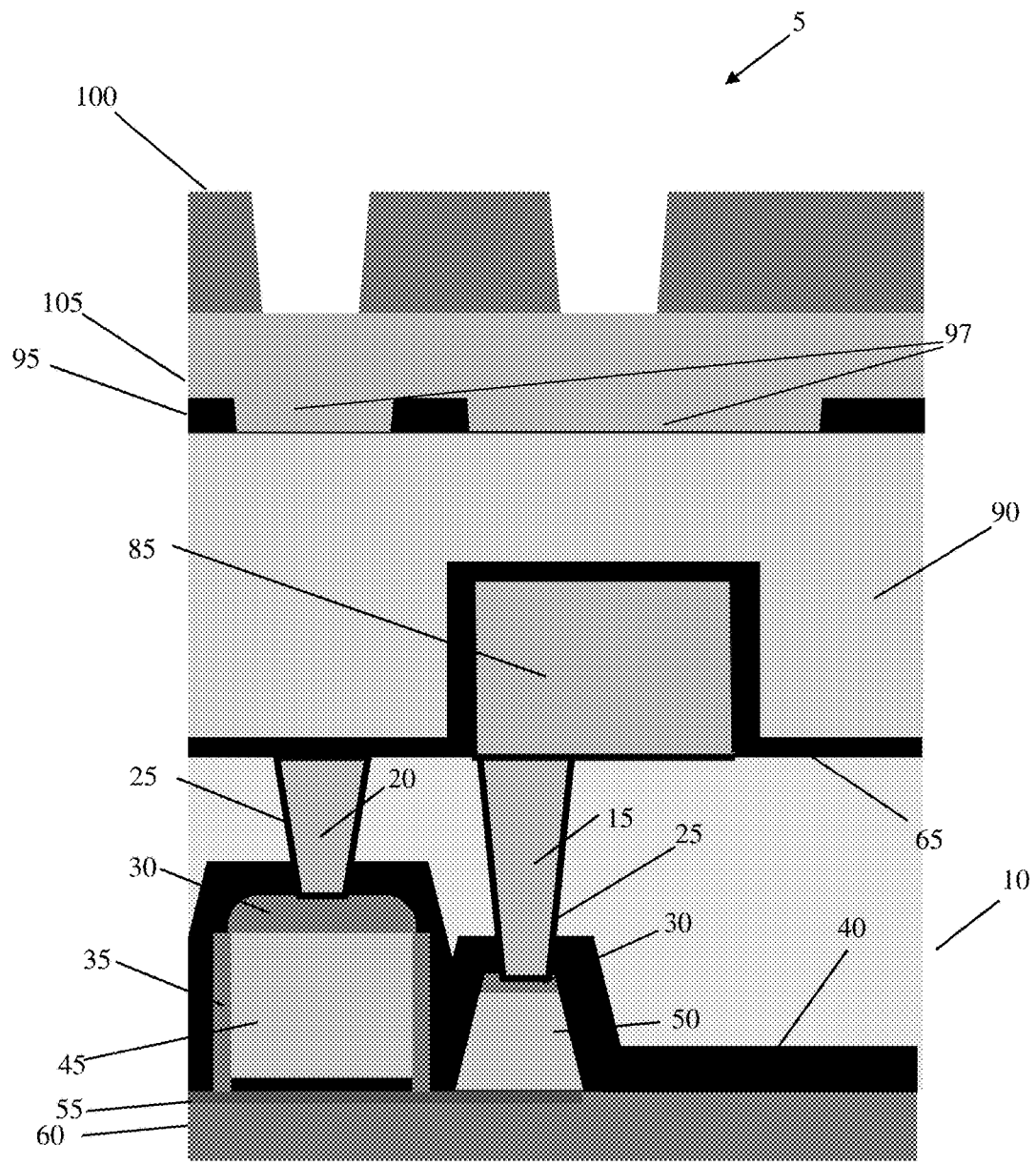
FIG. 8 shows a structure with planarized material, amongst other features, and respective fabrication processes in accordance with aspects of the present disclosure.

In FIG. 8, an organic planarization layer (OPL) 105 is deposited on the material 95 by a CVD process, among other examples. The planarization layer (OPL) 105 is also deposited within the openings 97 and over the material 90. A hardmask 100 (e.g., photolithographic stack) is deposited on the OPL 105 which is then subjected to a lithography process. In particular, the lithography process is a trench first, via last scheme.

Figure 9:
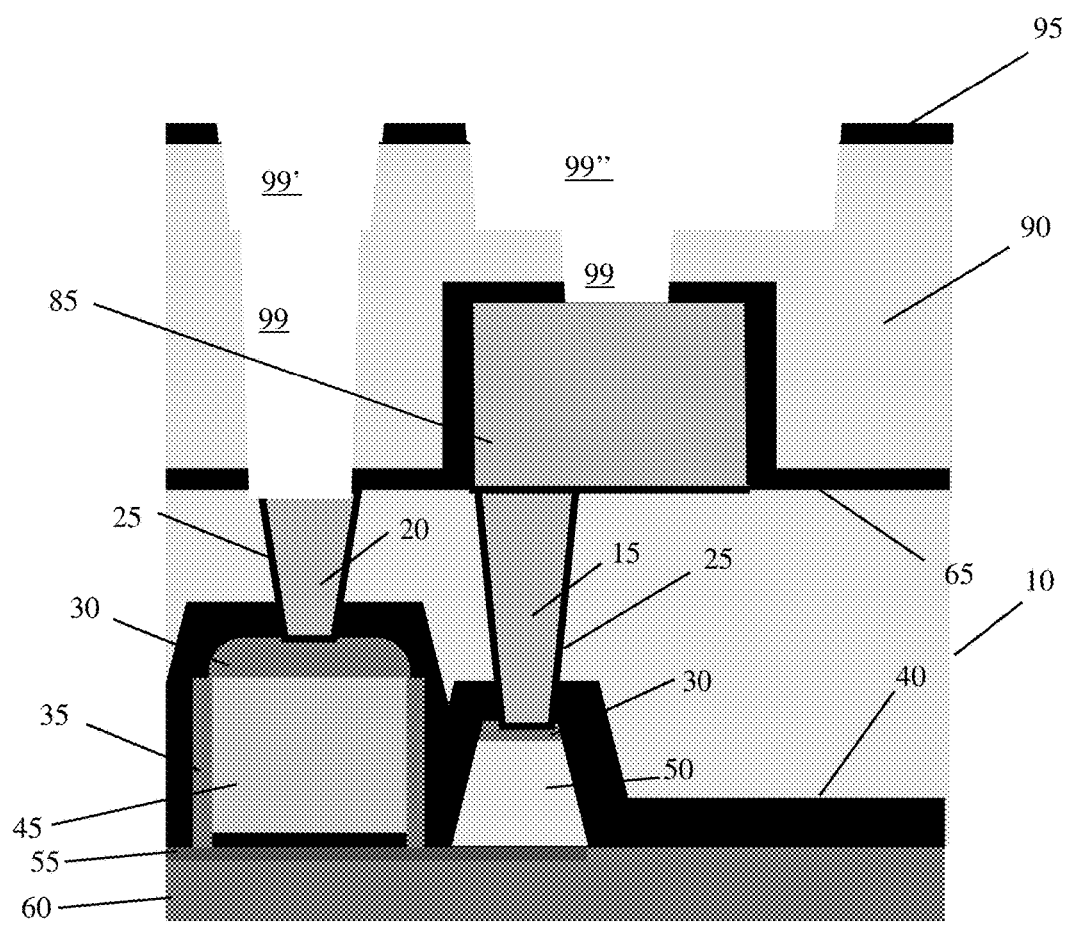
FIG. 9 shows a structure with contact vias forming to two different levels, amongst other features, and respective fabrication processes in accordance with aspects of the present disclosure.

In FIG. 9, a via 99 is formed in the OPL 105, stopping at the etch stop layer 65 on two different levels. A trench 99' and 99" is formed in the insulator material 90, using a second etching process using a patterned opening of the via 99 of the hardmask material 95. In embodiments, the patterning of the via 99 and the trenches 99', 99" can be a dual damascene process, which also removes a portion of the etch stop layer 65 (forms an opening) to expose both the plug 85 and the contact 20.

Figure 10:
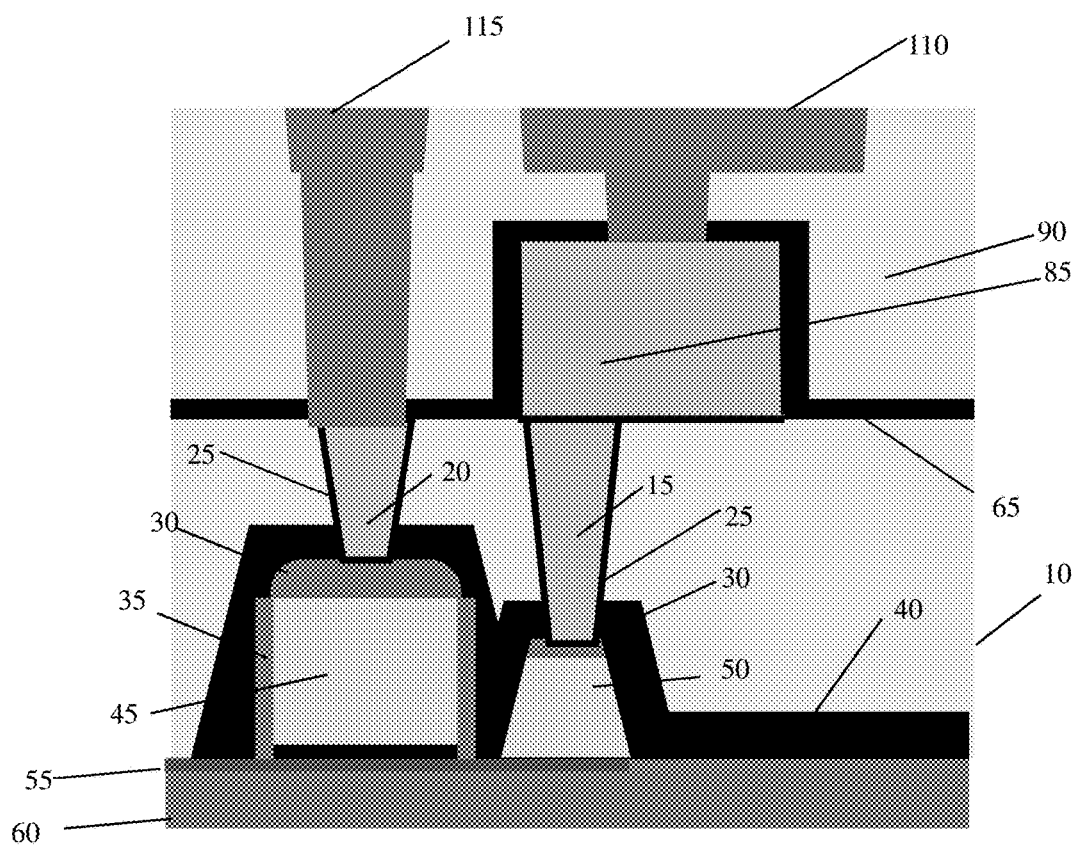
FIG. 10 shows a structure with metal fill at an upper level and a lower level, amongst other features, and respective fabrication processes in accordance with aspects of the present disclosure.

In FIG. 10, a plating process is performed to line and fill the vias and the trenches 99, 99', 99". In particular, the plating process includes a deposition of a barrier layer, a metal seed layer, and electroplating process. After the plating process is completed, a metal 110, 115 is deposited within the empty spaces of the vias and the trenches 99, 99', 99". The deposition of the barrier layer can be accomplished using a plasma-enhanced chemical vapor deposition (PECVD) process, among other examples. In an embodiment, the barrier layer can be one of titanium nitride (TiN) or tantalum nitride (TaN), although other materials can be used. The metal 110, 115 can be copper (Cu), as one example, contacting both tungsten contacts 20, 85 at different levels (e.g., tungsten contact 20 at a first level and tungsten contact 85 at a second, upper level). The metal materials can then undergo a planarization process, e.g., CMP, hence forming a metallization layer/wiring layer 110 at an upper level and a contact 115 at a lower level, contacting the tungsten plug (i.e., jumper contact) 85 and the contact 20, respectively. That is, the contact metals 110, 115 land on two different levels, directly landing and contacting on two different contacts 85, 20. The metallization layer/wiring layer 110 and the contact 115 can be dual damascene structures extending to upper levels of the structure.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a first contact at a first level of the structure;
   a jumper contact at a second, upper level of the structure;
   an etch stop layer having an opening exposing the first contact and partially encapsulating the jumper contact with an opening exposing the jumper contact; and
   contacts in electrical contact with the first contact at the first level and the jumper contact at the second, upper level, through the openings.

2. The structure of claim 1, wherein the jumper contact is in electrical contact with a second contact at a same level as the first contact.

3. The structure of claim 2, wherein the jumper contact is a tungsten plug structure.

4. The structure of claim 2, wherein the first contact is in electrical contact with a gate structure and the second contact is in electrical contact with a source/drain of the gate structure at a the first level of the structure.

5. The structure of claim 4, wherein the source/drain region is a raised source/drain region.

6. The structure of claim 5, wherein the contacts are copper extending to different levels of the structure.

7. The structure of claim 1, wherein the first contact and the jumper contact are tungsten.

8. The structure of claim 1, wherein the contacts are dual damascene structures extending to upper levels of the structure.

9. The structure of claim 1, wherein the contacts are different material than the jumper contact and the first contact.

10. A method, comprising:
    forming a first contact at a first level of a structure;
    forming a jumper contact at a second, upper level of the structure;
    forming an etch stop layer having an opening exposing the first contact and an opening over the jumper contact; and
    forming contacts in electrical contact with the first contact at the first level and the jumper contact at the second, upper level, through the openings of the etch stop layer.

11. The method of claim 10, further comprising forming a second contact at the first level, the first contact contacting a gate structure and the second contact contacting a raised source/drain region.

12. The method of claim 11, wherein the jumper contact is formed in electrical connection with the second contact, and the first contact, the second contact, and the jumper contact are of a same material.

13. The method of claim 11, wherein the contacts are formed by a dual damascene process which are filled with a copper material in direct contact with the jumper contact and the first contact.

14. The method of claim 10, wherein the jumper contact is encapsulated by the etch stop layer.

15. The method of claim 10, further comprising forming an interlevel dielectric over the etch stop layer.

16. The method of claim 15, further comprising etching the interlevel dielectric by a wet oxide etching process which stops on the etch stop layer to allow for encapsulation of the jumper contact and thickening of the etch stop layer.

17. A method, comprising:
    forming a gate structure on a substrate;
    forming a raised source/drain region on the substrate;
    forming a first contact to the gate structure at a first level;
    forming a second contact to the raised source/drain region at the first level;
    forming a jumper contact to the second contact area at a second, upper level, with respect to the first level; and
    forming dual damascene copper wiring structures landing on the first contact at the first level and on the jumper contact at the second, upper level.

18. The method of claim 17, further comprising encapsulating the jumper contact with an etch stop layer.

19. The method of claim 17, wherein the forming of the dual damascene copper wiring structures includes etching through the etch stop layer on a top surface of the first contact and on a stop surface of the jumper contact.

20. The method of claim 17, wherein the jumper contact, the first contact, and the second contact include tungsten material.

* * * * *